United States Patent
Plößl

(10) Patent No.: US 9,142,716 B2
(45) Date of Patent: Sep. 22, 2015

(54) OPTOELECTRONIC SEMICONDUCTOR COMPONENT, AND METHOD FOR THE MANUFACTURE OF AN OPTOELECTRONIC SEMICONDUCTOR COMPONENT

(71) Applicant: OSRAM Opto Semiconductors GmbH, Regensburg (DE)

(72) Inventor: Andreas Plößl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/373,947

(22) PCT Filed: Jan. 16, 2013

(86) PCT No.: PCT/EP2013/050731
§ 371 (c)(1),
(2) Date: Jul. 23, 2014

(87) PCT Pub. No.: WO2013/139494
PCT Pub. Date: Sep. 26, 2013

(65) Prior Publication Data
US 2015/0041840 A1    Feb. 12, 2015

(30) Foreign Application Priority Data

Mar. 22, 2012  (DE) .................. 10 2012 102 476

(51) Int. Cl.
*H01L 33/10* (2010.01)
*H01L 33/00* (2010.01)
(Continued)

(52) U.S. Cl.
CPC .............. *H01L 33/10* (2013.01); *H01L 33/005* (2013.01); *H01L 33/0079* (2013.01);
(Continued)

(58) Field of Classification Search
CPC .................. H01L 33/10; H01L 33/105; H01L 33/50–33/508; H01L 33/58–33/60; H01L 2924/0103; H01L 2924/01016; H01L 2924/01034; H01L 2924/01043; H01L 2924/013–2924/01405; H01L 2924/1204–2924/12044
USPC .......................................... 257/98; 438/29–32
See application file for complete search history.

(56) References Cited

U.S. PATENT DOCUMENTS

| 4,072,782 A | 2/1978 | Kramer et al. |
| 6,876,005 B2 | 4/2005 | Hsieh et al. |

(Continued)

FOREIGN PATENT DOCUMENTS

| DE | 10023353 A1 | 11/2001 |
| DE | 10331825 A1 | 2/2004 |

(Continued)

OTHER PUBLICATIONS

Bekkay, T., et al., "Structural and Optical Properties of CuAlTe2 Thin Films Prepared by RF. Sputtering," International Journal of Electronics, vol. 92, No. 8, Aug. 2005, pp. 445-449.

(Continued)

*Primary Examiner* — Daniel Shook
(74) *Attorney, Agent, or Firm* — Slater & Matsil, L.L.P.

(57) ABSTRACT

In at least one embodiment, the semiconductor component includes a semiconductor layer sequence with an active layer for generating an electromagnetic radiation. The semiconductor component includes a radiation-permeable element and a connecting element. The connecting element is layered in form and connects the radiation-permeable element and the semiconductor layer sequence to another mechanically. The connecting element is designed to be passed through by at least one part of the radiation generated in the active layer. A refractive index of the connecting means deviates from a refractive index of the semiconductor layer sequence by a maximum of 25%. The connecting element includes at least two principal components, which are solids at a temperature of 300 K. At least one of the principal components has a melting temperature of no more than 750 K.

17 Claims, 3 Drawing Sheets

(51) Int. Cl.
H01L 33/50 (2010.01)
H01L 33/58 (2010.01)

(52) U.S. Cl.
CPC .............. H01L 33/50 (2013.01); H01L 33/58 (2013.01); H01L 2933/0041 (2013.01); H01L 2933/0058 (2013.01); H01L 2933/0083 (2013.01)

(56) References Cited

U.S. PATENT DOCUMENTS

| | | | |
|---|---|---|---|
| 7,455,461 | B2 | 11/2008 | Höhn et al. |
| 7,955,531 | B1 | 6/2011 | Khanarian |
| 7,982,228 | B2 | 7/2011 | Choi et al. |
| 2002/0030194 | A1* | 3/2002 | Camras et al. .................. 257/98 |
| 2002/0141006 | A1 | 10/2002 | Pocius et al. |
| 2008/0121911 | A1 | 5/2008 | Andrews et al. |

FOREIGN PATENT DOCUMENTS

| | | |
|---|---|---|
| DE | 102007055170 A1 | 6/2008 |
| DE | 112009002311 T5 | 1/2012 |
| EP | 1860471 A1 | 4/2007 |

OTHER PUBLICATIONS

Carr, W.N., "Photometric Figures of Merit for Semiconductor Luminescent Sources Operating in Spontaneous Mode," Infrared Physics, vol. 6, Sep. 24, 1965, pp. 1-19.

Guha, P., et al., "Synthesis and Characterization of CuGaTe2 Films Prepared by Three Source Co-Evaporation Technique," Journal of Physics D: Applied Physics, vol. 35, Jun. 18, 2002, pp. 1504-1511.

"IR Lumineszenzdiode (850 nm) Mit Hoher Ausgangsleistung, High Power Infrared Emitter (850 nm), Lead (Pb) Free Product—Rohs Compliant, SFH 4235", OSRAM Opto Semiconductor, Mar. 30, 2011, 8 pages.

Krames, M.R., et al., "High-Power Truncated-Inverted-Pyramid (AlxGa1-x)0.5In0.5P/GaP Light-Emitting Diodes Exhibiting 50% External Quantum Efficiency" Applied Physics Letters, vol. 75, No. 16, Oct. 18, 1999, pp. 2365-2367.

Li, H.H., "Refractive Index of ZnS, ZnSe, and ZnTe and Its Wavelength and Temperature Derivatives," Journal of Physical and Chemical Reference Data, vol. 13, No. 1, Jan. 1984, pp. 103-150.

Li, J., et al., "Optical Brazing Technique for Bonding Diamond Films to Zinc Sulfide," Diamond and Related Materials, vol. 11, Issues 3-6, Mar.-Jun. 2002, pp. 753-756.

Marple, D.T.F., "Refractive Index of ZnSe, ZnTe, and CdTe," Journal of Applied Physics, vol. 35, No. 3, Mar. 1964, pp. 539-542.

Morita, Y., et al., "Preparation and Properties of Single Crystal CuAlSe2 Film," Japanese Journal of Applied Physics, vol. 30, No. 7B, Jul. 1991, pp. L1238-L1240.

"Zinc Sulfide Clear Grade (ZnS)," Introduction to Optical Materials and Optical Design Data, Optical Material Specification, ISP Optics: The Infrared Company, IR Catalog, 2011, pp. 26, http://www.ispoptics.com/.

Raadik, T., et al., "Photoreflectance Study of AgGaTe2 Single Crystals," Physica B: Physics of Condensed Matter, vol. 40, No. 3, Feb. 1, 2011, pp. 418-420.

Scheer, R., et al., "Chalcogenide Photovoltaics, Fig. 4.8, Heterocontact Lattice Parameter," Wiley VCH, Weinheim, 2011.

Sharma, R.C., et al., "Thermodynamic Analysis and Phase Equilibria Calculations for the Zn-Te, Zn-Se and Zn-S Systems," Journal of Crystal Growth, vol. 88, Issue 2, Apr. 2, 1988, pp. 193-204.

Singh, M., et al., "Preparation and Characterization of Zn-Se Bilayer Thin Film Structure," Applied Surface Science, vol. 239, No. 1, Dec. 15, 2004, pp. 79-86.

Suh, C., et al., "Combinatorial Design of Semiconductor Chemistry for Bandgap Engineering: "Virtual" Combinatorial Experimentation," Applied Surface Science, vol. 223, Issue 1-3, Feb. 15, 2004, pp. 148-158.

You, S.H., et al., "Temperature Dependence of Band Gap and Photocurrent Properties for the AgInS2 Epilayers Grown by Hot Wall Epitaxy," Journal of Crystal Growth, vol. 245, Issues 3-4, Nov. 2002, pp. 211-266.

* cited by examiner

FIG 4B)

| | | |
|---|---|---|
| CuAlS2 | 3,49 | Applied Surface Science 223 (2004) 148-158; doi:10.1016/S0169-4332(03)00918-8 |
| AgAlS2 | 3,13 | Applied Surface Science 223 (2004) 148-158; doi:10.1016/S0169-4332(03)00918-8 |
| CuAlSe2 | 2,7 | Japanese Journal of Applied Physics, Volume 30, Issue 7B, pp. L1238-L1240 (191); DOI: 10.1143/JJAP.30.L1238 |
| AgGaS2 | 2,64 | Applied Surface Science 223 (2004) 148-158; doi:10.1016/S0169-4332(03)00918-8 |
| AgAlSe2 | 2,55 | Applied Surface Science 223 (2004) 148-158; doi:10.1016/S0169-4332(03)00918-8 |
| CuAlTe2 | 2,45 | International Journal of Electronics, Volume 92, Issue 8; 2005, 445-449; DOI:10.1080/00207210412331334806 |
| CuGaS2 | 2,43 | Applied Surface Science 223 (2004) 148-158; doi:10.1016/S0169-4332(03)00918-8 |
| AgAlTe2 | 2,27 | Applied Surface Science 223 (2004) 148-158; doi:10.1016/S0169-4332(03)00918-8 |
| AgInS2 | 1,87 | Journal of Crystal Growth 245 (2002) 261-266 |
| AgGaSe2 | 1,8 | Applied Surface Science 223 (2004) 148-158; doi:10.1016/S0169-4332(03)00918-8 |
| CuGaSe2 | 1,68 | Applied Surface Science 223 (2004) 148-158; doi:10.1016/S0169-4332(03)00918-8 |
| CuInS2 | 1,53 | Applied Surface Science 223 (2004) 148-158; doi:10.1016/S0169-4332(03)00918-8 |
| AgGaTe2 | 1,32 | Physica B406(2011)418-420; doi:10.1016/j.physb.2010.11.002 |
| CuGaTe2 | 1,24 | J. Phys. D: Appl. Phys. 35(13) 1504; doi: 10.1088/0022-3727/35/13/309 |
| AgInSe2 | 1,24 | Applied Surface Science 223 (2004) 148-158; doi:10.1016/S0169-4332(03)00918-8 |
| CuInTe2 | 1,06 | Applied Surface Science 223 (2004) 148-158; doi:10.1016/S0169-4332(03)00918-8 |
| CuInSe2 | 1,03 | Applied Surface Science 223 (2004) 148-158; doi:10.1016/S0169-4332(03)00918-8 |
| AgInTe2 | 0,95 | Applied Surface Science 223 (2004) 148-158; doi:10.1016/S0169-4332(03)00918-8 |

OPTOELECTRONIC SEMICONDUCTOR COMPONENT, AND METHOD FOR THE MANUFACTURE OF AN OPTOELECTRONIC SEMICONDUCTOR COMPONENT

This patent application is a national phase filing under section 371 of PCT/EP2013/050731, filed Jan. 16, 2013, which claims the priority of German patent application 10 2012 102 476.6, filed Mar. 22, 2012, each of which is incorporated herein by reference in its entirety.

TECHNICAL FIELD

An optoelectronic semiconductor component is specified. Furthermore, a method for the manufacture of an optoelectronic semiconductor component is specified.

SUMMARY OF THE INVENTION

Embodiments of the invention specify an optoelectronic semiconductor component which has a high light coupling-out efficiency.

In accordance with at least one embodiment, the optoelectronic semiconductor component comprises one or a plurality of semiconductor layer sequences. The semiconductor layer sequence is preferably based on a III-V compound semiconductor material. The semiconductor material is, for example, a nitride compound semiconductor material such as $Al_n In_{1-n-m} Ga_m N$ or a phosphide compound semiconductor material such as $Al_n In_{1-n-m} Ga_m P$ or an arsenide compound semiconductor material such as $Al_n In_{1-n-m} Ga_m As$, wherein in each case $0 \leq n \leq 1$, $0 \leq m \leq 1$ and $n+m \leq 1$. In this case, the semiconductor layer sequence can comprise dopants and additional constituents. For the sake of simplicity, however, only the essential constituents of the crystal lattice of the semiconductor layer sequences, that is to say Al, As, Ga, In, N or P, are indicated, even if these can be replaced and/or supplemented in part by small amounts of further substances.

The semiconductor layer sequence comprises one or a plurality of active layers. The at least one active layer is designed for generating an electromagnetic radiation. By way of example, the active layer includes at least one pn junction or at least one quantum well structure. In particular, ultraviolet, visible and/or near-infrared radiation are/is generated in the active layer during the operation of the semiconductor component. The radiation generated in the active layer has a peak wavelength. The peak wavelength is that wavelength at which the highest radiation intensity is generated during operation as intended.

In accordance with at least one embodiment, the semiconductor component comprises one or a plurality of radiation-transmissive elements. In this case, radiation-transmissive relates to the radiation generated by the semiconductor layer sequences and/or to the radiation emitted by the optoelectronic semiconductor component. The radiation-transmissive element preferably implements an optical function and can actively influence a spectral composition of the radiation emitted by the semiconductor component or can crucially influence an emission characteristic of the semiconductor component. It is possible for the semiconductor layer sequence and the radiation-transmissive element to be produced separately from one another.

In accordance with at least one embodiment, the semiconductor component comprises at least one connecting element. The connecting element is shaped in a layer-like fashion. Furthermore, the connecting element is radiation-transmissive to at least part of the radiation generated in the active layer. Preferably, the connecting element is transparent.

In accordance with at least one embodiment, the connecting element is designed such that the radiation generated in the active layer partly or wholly passes through said connecting element. By way of example, the connecting element is situated above the semiconductor layer sequence, along a main emission direction of the semiconductor layer sequence and/or of the semiconductor component. The connecting element can completely or substantially completely cover a main side of the semiconductor layer sequence, as seen in plan view.

In accordance with at least one embodiment, the element and the semiconductor layer sequence are mechanically connected to one another via the connecting element. The mechanical connection is preferably stable and permanent. This means that the connection produced via the connecting element, during use of the semiconductor component as intended, does not become detached over the lifetime of the semiconductor component.

In accordance with at least one embodiment, the refractive indices of the connecting element and of the semiconductor layer sequence deviate from one another by at most 25% or by at most 15% or by at most 10% or by at most 5%. In this case, the refractive indices are related in particular to the peak wavelength of the radiation generated in the active layer. The refractive indices can be average refractive indices in each case.

In accordance with at least one embodiment, the connecting element comprises at least two or exactly two main constituents. Main constituents are understood to be, in particular, elements from the periodic system. If chemical or physical properties of the main constituents are specified, then these properties preferably relate to a macroscopic amount of substance composed of the main constituent, referred to as bulk.

In accordance with at least one embodiment, the main constituents are solids at room temperature, that is to say at a temperature of approximately 300 K. The main constituents are therefore not gases such as oxygen or nitrogen. The indication of the state of matter relates to a pressure of 1013 hPa.

In accordance with at least one embodiment, one of the main constituents has or two or at least two of the main constituents have a melting point of at most 750 K or at most 700 K. In other words, at least one of the main constituents has a low melting point. In particular, the melting point of at least one of the main constituents is below a temperature at which the semiconductor layer sequence incurs damage and/or the lifetime of said semiconductor layer sequence is significantly reduced.

According to at least one embodiment, the semiconductor component comprises at least one semiconductor layer sequence having an active layer for generating an electromagnetic radiation. The semiconductor component furthermore comprises at least one radiation-transmissive element and at least one connecting element. The connecting element is shaped in a layer-like fashion. The semiconductor layer sequence and the radiation-transmissive element are mechanically connected to one another via the connecting element. The connecting element is radiation-transmissive and designed such that at least part of the radiation generated in the active layer passes through said connecting element. A refractive index of the connecting element deviates from a refractive index of the semiconductor layer sequence by at most 25% or by at most 10%. The connecting element comprises at least two or exactly two main constituents which are elements from the periodic system. The main constituents are solids at a temperature of 300 K. At least one of the main constituents or all of the main constituents has/have a melting point of at most 750 K.

Semiconductor layer sequences based on AlInGaN, for example, for light-emitting diodes for generating white light have a comparatively high optical refractive index of approximately 2.5. By means of total internal reflection, therefore, at boundary surfaces of the semiconductor layer sequence, a relatively high proportion of radiation is prevented from emerging from the semiconductor layer sequence. This problem also occurs, besides the direct coupling-out of the radiation from the semiconductor layer sequence, if the radiation is intended to be coupled into a radiation-transmissive element. Even if the refractive indices of the element and of the semiconductor layer sequence themselves are similar to one another, an optical barrier is often present as a result of a connecting element such as an adhesive having a comparatively low optical refractive index. Consequently, total reflection occurs for instance at the adhesive and optical losses result.

The connecting element described is, in particular, a so-called optical brazing alloy. The connecting element has a comparatively high optical refractive index and losses as a result of total internal reflection can thus be reduced or avoided. Furthermore, surface roughnesses of the semiconductor layer sequence and/or of the radiation-transmissive element can be compensated for by the connecting element. By virtue of the fact that the connecting element comprises at least one main constituent having a low melting point, comparatively low joining temperatures are achievable. A lifetime of the semiconductor component can be increased as a result.

In accordance with at least one embodiment, the connecting element comprises one or a plurality of the materials mentioned below or consists of one or a plurality of these materials: ZnS, ZnSe, ZnTe, CdS, CdSe, CdTe, MgSe, MgTe, MgS. The material of the connecting element can therefore be a compound comprising S, Se, Te, in particular a binary compound comprising S, Se, Te and comprising a metal, that is to say for instance 2-16 compounds or 12-16 compounds, the numbers being the group designation in the periodic table of the elements.

Furthermore, it is possible for the material of the connecting element to be formed from a ternary compound, in particular from $Ge_{25}Ga_{10}S_{65}$, or from a quaternary compound such as BeMgZnSe. In the case of the ternary and quaternary compounds, preferably one component is in each case S, Se or Te and at least one further component is a metal or a semiconductor, preferably from one of groups 2, 12, 13 or 14 of the periodic table of the elements.

In particular, the material of the connecting element can be $11$-$13$-$16_2$ compounds, also referred to as chalcopyrites. Such compounds are, for example, $CuGaS_2$, $CuGaSe_2$, $CuGaTe_2$, $CuInS_2$, $CuInSe_2$, $CuInTe_2$, $AgAlS_2$, $AgAlSe_2$, $AgAlTe_2$, $AgGaS_2$, $AgGaSe_2$, $AgGaTe_2$, $AgInS_2$, $AgInSe_2$ or $AgInTe_2$. Furthermore, $2$-$11_2$-$16_2$ compounds such as $BaCu_2S_2$ can be used for the connecting element.

In accordance with at least one embodiment, the connecting element is free of a layer provided for generating radiation. In other words, no radiation in the ultraviolet, visible and near-infrared spectral range is generated in the connecting element during use as intended.

In accordance with at least one embodiment, the material of the connecting element differs from the materials of the semiconductor layer sequence and/or of the radiation-transmissive element. Preferably, different material systems are also involved. Different material system can mean that the materials differ from one another in at least one or in all of their main constituents.

In accordance with at least one embodiment, the refractive index of the connecting element and the refractive index of the radiation-transmissive element deviate from one another by at most 25% or by at most 15% or by at most 10% or by at most 5%. An efficient coupling of light out of the connecting element into the radiation-transmissive element is possible as a result.

In accordance with at least one embodiment, the coefficients of thermal expansion of the connecting element and of the radiation-transmissive element and/or of the semiconductor layer sequence are similar to one another. Similar can mean that the coefficients of expansion deviate from one another by at most a factor of 4 or by at most a factor of 2 or by at most a factor of 1.5. Thermal loadings in particular of the semiconductor layer sequence can be reduced as a result.

In accordance with at least one embodiment, the radiation-transmissive element is an optical body or the radiation-transmissive element comprises at least one optical body. The optical body can have radiation coupling-out structures such as roughenings or surface structurings. In particular, the optical body serves for efficiently coupling the radiation generated in the semiconductor layer sequence out of the semiconductor component. Alternatively or additionally, it is possible for the radiation-transmissive element to have beam shaping properties and to be fashioned, for example, in the form of a converging lens or a lens array.

In accordance with at least one embodiment, the radiation-transmissive element is a conversion element for wavelength conversion of the radiation generated by the semiconductor layer sequence or the element comprises such a conversion element. In particular, the element then absorbs the entire or part of the radiation generated by the semiconductor layer sequence and converts said radiation into a radiation having a longer wavelength. The element is transmissive to the radiation having this longer wavelength. In this case, transmissive preferably means that the converted radiation can leave the element. In this case, the element has a transmission at the wavelength of the converted radiation of, for example, at least 2% or at least 5% or at least 10%, as seen in transmitted view. As a result, a mixed radiation can be emitted by the semiconductor component. The mixed radiation can be white light.

In accordance with at least one embodiment, the radiation-transmissive element is a further semiconductor layer sequence having an active layer for generating radiation or the element comprises such a further semiconductor layer sequence. The further semiconductor layer sequence can be designed for generating a radiation having the same peak wavelength as the first semiconductor layer sequence. It is likewise possible for the two semiconductor layer sequences to emit radiation at mutually different peak wavelengths during use as intended. It is possible for more than one further semiconductor layer sequence to be present. In addition to the further semiconductor layer sequence, further elements, for example, in the form of an optical body or a conversion element, can be present.

In accordance with at least one embodiment, the connecting element is penetrated by roughness peaks of the semiconductor layer sequence. In other words, the connecting element then does not form a closed layer. However, the connecting element can be a continuous layer. As a result, it is possible to realize an electrically conductive connection through the connecting element.

In accordance with at least one embodiment, the semiconductor component comprises an intermediate layer. The intermediate layer is preferably electrically conductive and radiation-transmissive. By way of example, the intermediate layer is shaped from a transparent conductive oxide, TCO for short. The intermediate layer is situated, in particular, at a side of the semiconductor layer sequence which faces the connecting element. The intermediate layer can be in direct contact with the semiconductor layer sequence and/or with the connecting element. The intermediate layer can be a current spreading layer for the semiconductor layer sequence.

In accordance with at least one embodiment, the intermediate layer has roughness peaks which penetrate the connecting element. By way of example, the intermediate layer is provided with a corresponding surface structuring.

In accordance with at least one embodiment, the connecting element has an average thickness which is at least a factor of 1.5 or at least a factor of 2 or at least a factor of 3 greater than the sum of mean roughnesses of sides of the semiconductor layer sequence and of the radiation-transmissive element which face the connecting element layer. Alternatively, the average thickness of the connecting element exceeds the sum of the mean roughnesses of the intermediate layer and of the semiconductor layer sequence and/or of the radiation-transmissive element. In other words, the connecting element layer is then so thick that unevennesses both of the semiconductor layer sequence and of the radiation-transmissive element can be compensated for. The connecting element is then preferably a continuous, uninterrupted layer, in particular without cutouts and penetrations.

In accordance with at least one embodiment, the connecting element is in direct, physical contact with the radiation-transmissive element and/or with the semiconductor layer sequence. In other words, the connecting element and the element and/or the semiconductor layer sequence can touch one another in places or over the whole area or substantially over the whole area.

Furthermore, a method for the manufacture of an optoelectronic semiconductor component is specified. Preferably, a semiconductor component as specified in conjunction with one or more of the embodiments mentioned above is produced by the method. Therefore, features of the method are also disclosed for the semiconductor component and vice versa.

In at least one embodiment, the method comprises at least or exclusively the following steps. The semiconductor layer sequence and the radiation-transmissive element are provided. The connecting element is applied to the semiconductor layer sequence and/or to the radiation-transmissive element. The semiconductor layer sequence is connected to the radiation-transmissive element.

The main constituents of the connecting element or at least two of the main constituents of the connecting element are in this case each applied separately from one another in at least two partial layers alternately one above another. If the connecting element comprises, for example, exactly two main constituents, then first partial layers comprise the first main constituent and second partial layers comprise the second main constituent and the first and second partial layers succeed one another alternately. The partial layers preferably each comprise only exactly one of the main constituents, within the scope of the manufacturing tolerances.

A connecting temperature is present during connecting. The connecting temperature is preferably greater than the melting point of at least one of the main constituents. The main constituents mix together during the step of connecting the semiconductor layer sequence to the radiation-transmissive element. Mixing together means, for example, that the main constituents intermix randomly or that the main constituents react to form a stoichiometric compound with a fixed distribution of the main constituents among ordered sites of a sublattice of a crystal.

In accordance with at least one embodiment, the connecting temperature is less than or equal to a melting point of the finished produced connecting element.

In accordance with at least one embodiment of the method, the connecting temperature is between the melting points of the main constituents. In other words, the mechanical connection between the semiconductor layer sequence and the radiation-transmissive element is produced with a comparatively low connecting temperature. By way of example, the connecting temperature is at most 750 K or at most 700 K or at most 600 K or at most 550 K.

In other words, then for example, only the first partial layers are melted and the main constituent of the first partial layers incipiently dissolves and/or fully dissolves the main constituent in the second partial layers. It is possible that the second partial layers do not undergo transition to a liquid phase.

In accordance with at least one embodiment of the method, the connecting temperature is above the melting points of at least two of the main constituents or of all of the main constituents. In that case, preferably all of the partial layers are briefly melted.

In accordance with at least one embodiment, a total of at least twenty or at least forty or at least sixty of the partial layers are applied. Alternatively or additionally, the number of partial layers is at most 300 or at most 200 or at most 160.

In accordance with at least one embodiment of the method, the partial layers dissolve during connecting and the connecting element is embodied as a homogeneous layer. In this case, homogeneous can mean that no targeted material variations are present in the connecting element. Preferably, one and the same material formed from the main constituents is present across the entire connecting element, within the scope of the manufacturing tolerances.

In accordance with at least one embodiment, before the connecting step, the partial layers have thicknesses such that the main constituents are present in a stoichiometrically correct quantitative ratio with respect to one another for the material of the connecting element. If the material of the connecting element is ZnSe, for example, then the partial layers comprising Zn and the partial layers comprising Se are applied with thicknesses such that Zn and Se are present in a quantitative ratio of 1:1 with regard to the number of atoms. In other words, it is possible that a stoichiometrically correct compound arises from the different partial layers during connecting, within the scope of the manufacturing tolerances.

In accordance with at least one embodiment, at least one of the main constituents is radiation-nontransmissive to the radiation generated in the active layer. In other words, the connecting element can be opaque before the connecting step. The radiation transmissivity of the connecting element is then achieved only during the connecting step and during the mixing and/or reacting of the main constituents with one another.

If the main constituents are deposited in each case as partial layers, a minimum joining temperature is determined by the lowest melting point of the different main constituents. It is not necessary for the connecting temperature to be above the melting points of all the main constituents. In other words, at least the main constituent having a low melting point melts during connecting and in this case solidifies preferably isothermally with formation of the actual material of the connecting element during reacting/mixing with the at least one further main constituent.

If the finished produced connecting element is a tertiary or a quaternary compound, then preferably exactly two types of partial layers having different compositions are present. The first partial layers, for example, comprise the main constituent having a low melting point or all of the main constituents having a low melting point, such as S, Se, Te or Zn. The second partial layers can then be formed exclusively from the further main constituents. The first and/or the second partial layers can thus be shaped from a binary or tertiary compound. Such partial layers can be produced by means of sputtering, for example.

As an alternative thereto, it is possible for the main constituents to be present in each case in separate partial layers. Each of the partial layers then comprises exactly one of the main constituents, within the scope of the manufacturing tolerances.

If at least one of the main constituents in the partial layers is radiation-nontransmissive, then heat can be coupled into the joining zone by means of radiation. Targeted melting is possible as a result.

In accordance with at least one embodiment, joining areas of the reaction zone are directly delimited in particular by the semiconductor layer sequence and the radiation-transmissive element. Evaporation and volatilization of constituents of the connecting element during connecting can be prevented or reduced as a result. Preferably, a pressure is exerted on the partial layers and/or the connecting element during the connecting step.

DETAILED DESCRIPTION OF ILLUSTRATIVE EMBODIMENTS

Figure 1:
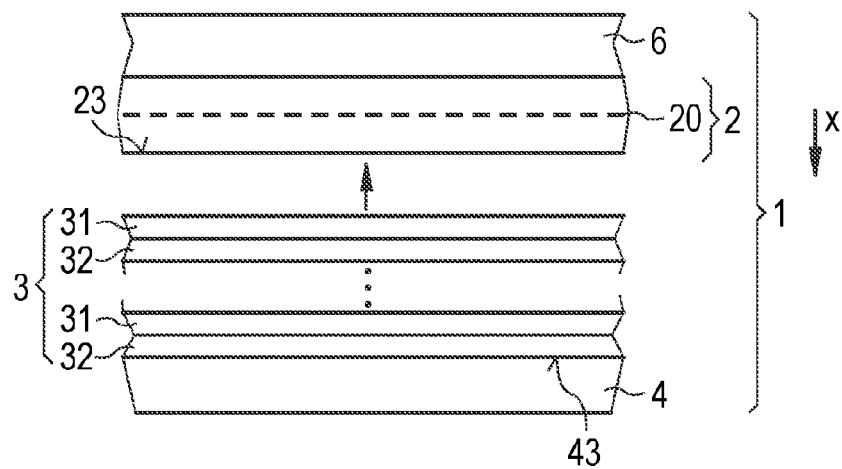
FIGS. 1, 5A and 5B show schematic illustrations of methods for the manufacture of optoelectronic semiconductor components described here.

FIG. 1 schematically shows an exemplary embodiment of a method for the manufacture of an optoelectronic semiconductor component 1. A semiconductor layer sequence 2 having an active layer 20 is provided. The semiconductor layer sequence 2 is situated at a carrier 6. The carrier 6 can be a growth substrate of the semiconductor layer sequence 2 or a replacement substrate that differs from a growth substrate.

The semiconductor layer sequence 2 has a growth direction x oriented perpendicularly to the carrier 6. A main emission direction of the semiconductor layer sequence 2 is preferably parallel to the growth direction x. Furthermore, a radiation-transmissive element 4 is provided. On a side 43 of the element 4, first partial layers 31 and second partial layers 32 of a connecting element 3 are applied alternately. The partial layers 31, 32 each comprise exactly one main constituent of the connecting element 3. By way of example, the first partial layers 31 are made from Zn, and the second partial layers 32 from S.

FIG. 1 schematically depicts only in each case two of the first partial layers 31 and of the second partial layers 32. Significantly more than the partial layers 31, 32 depicted can be present.

For connecting purposes, the radiation-transmissive element 4 with the partial layers 31, 32 is positioned relative to the semiconductor layer sequence 2 at the carrier 6 in such a way that the connecting element 3 is situated at the side 43 of the radiation-transmissive element 4 which faces the semiconductor layer sequence 2. Afterward, the semiconductor layer sequence 2 and the element 4 are pressed onto one another, symbolized by the arrow between these component parts in FIG. 1. As a result of the action of temperature, a mechanically fixed, permanent connection between the radiation-transmissive element 4 and the semiconductor layer sequence 2 is then produced via the connecting element 3.

The connecting element 3 is situated between the radiation-transmissive element 4 and the semiconductor layer sequence 2 along the growth direction x in the finished produced semiconductor component 1.

During the process of connecting the semiconductor layer sequence 2 to the element 4, in particular the second partial layers 32 melt and the Zn partial layers 31 dissolve as a result. This gives rise to the layer comprising the connecting element 3, which is radiation-transmissive after the connecting process. Before the connecting process, as long as the partial layers 31, 32 are present, the connecting element 3 is nontransmissive to radiation generated in the active layer 20.

Figure 2:
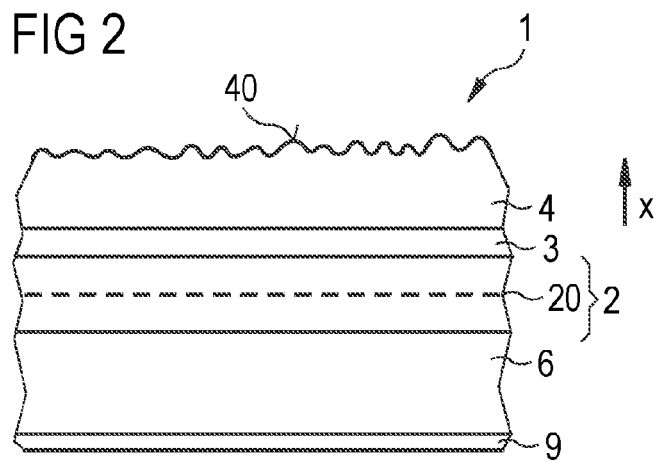
FIGS. 2 and 3 show schematic sectional illustrations of exemplary embodiments of optoelectronic semiconductor components described here.

A further exemplary embodiment of the semiconductor component 1 is indicated in a sectional illustration in FIG. 2. The semiconductor layer sequence 2 is based on AlInGaN, for example, and emits blue light, in particular, during operation. The semiconductor component 1 is a light-emitting diode. The element 4 is fashioned as a conversion element and comprises a ceramic converter lamina. The element 4 absorbs part of the radiation generated in the active layer 20, such that preferably white mixed light is emitted by the semiconductor component 1 during operation.

The connecting element 3 is preferably shaped from ZnS and has a refractive index of approximately 2.45 at a wavelength of 468 nm. As a result, total internal reflection at an interface between the semiconductor layer sequence 2 and the connecting element 3 is virtually preventable. Consequently, radiation can pass from the semiconductor layer sequence 2 into the element 4 via the connecting element 3 with very low losses. Moreover, ZnS has a good thermal conductivity, such that the element 4 is thermally efficiently coupled to the semiconductor layer sequence 2 and to the carrier 6 via the connecting element 3. ZnS has a coefficient of linear thermal expansion of approximately $6.5 \times 10^{-6}$ 1/K, which is well matched to the coefficients of thermal expansion of materials such as sapphire or germanium which can be used for the carrier 6, for example.

Before the connecting step, the connecting element 3 is formed, for example, from a layer stack having a total of 100 periods of 1.5 nm thick zinc layers and 2.5 nm thick sulfur layers. Under a pressing pressure of approximately 1 MPa and at a connecting temperature of approximately 160° C., the radiation-transmissive element 4 is then fixed to the semiconductor layer sequence 2.

It is optionally possible for a metallization 9 to be fitted to that side of the carrier 6 which faces away from the semiconductor layer sequence 2. Such a metallization 9 can also be present in all of the other exemplary embodiments.

Figure 3:
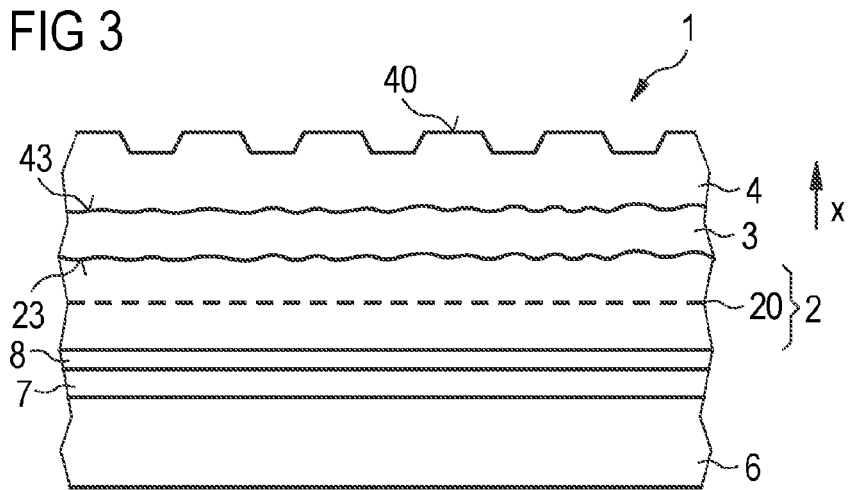

FIG. 3 shows a further exemplary embodiment of the semiconductor component 1. The semiconductor layer sequence 2 is based on AlGaInP, in particular, and emits in the red, orange or green spectral range during operation. The element 4 is an optical body having a light coupling-out structure. The element 4 is based on or consists of GaP, for example. The element 4 can be provided with structurings as specified in the document Carr, Photometric Figures of Merit for Semiconductor Luminescent Sources Operating in Spontaneous Mode, in Infrared Physics, 6, pages 1 to 19, 1966. The disclosure content of said document is incorporated by reference.

Before the connecting process, the connecting element is formed, for example, from a stack of 16 periods of 64 nm thick Se layers and 36 nm thick Zn layers. The connecting process is effected at a pressure of approximately 0.2 MPa and at a temperature of approximately 250° C.

The partial layers comprising the Se melt at a temperature of approximately 221° C. The layer thickness of all the Se layers altogether, which is approximately 1 µm, allows unevennesses between the element 4 and the semiconductor layer sequence 2 to be evened out upon the melting of the Se layers, symbolized in FIG. 3 by roughenings of the sides 23, 43 facing the connecting element 3.

The liquefied Se melt incipiently dissolves the Zn and a reaction to form ZnSe takes place until all the Zn has been consumed. The reaction has concluded, for example, after a reaction time of approximately 30 min.

ZnSe has a thermal conductivity of approximately 18 W/m K and a coefficient of linear thermal expansion of approximately $7.6 \times 10^{-6}$ 1/K, which is similar to possible carrier materials GaAs, Ge or sapphire.

As also in all of the other exemplary embodiments, it is possible for a mirror layer 8 and/or a joining layer 7 to be situated between the semiconductor layer sequence 2 and the carrier 6.

Figure 4:
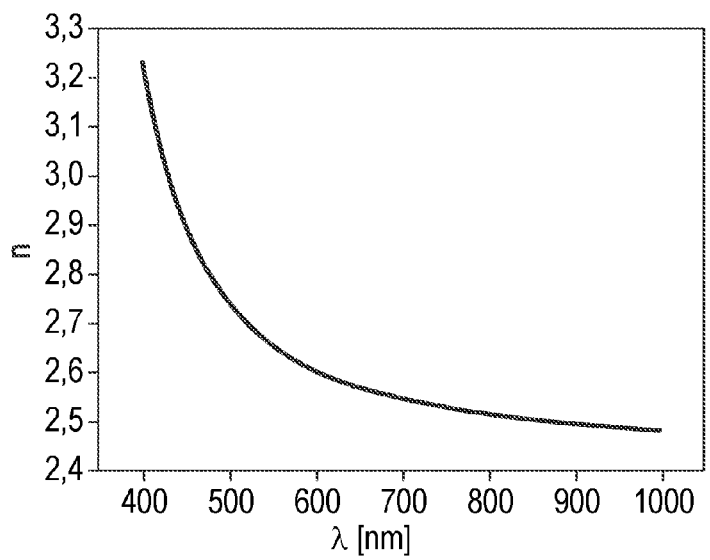
FIGS. 4A and 4B show a schematic illustration of properties of materials for a connecting element described here.

FIG. 4A depicts a profile of the refractive index n in relation to the wavelength $\lambda$, indicated in nm, for ZnSe. Band gaps and source references therefor for possible materials for the connecting element 3 are compiled in FIG. 4B. The compounds are indicated in the first column, the band gaps in the second column and the source references in the third column. Lattice constants for such compounds are indicated in the document Roland Scheer, Hans-Werner Schock: Chalcogenide Photovoltaics, Verlag Wiley VCH, Weinheim, 2011, in particular in conjunction with figure 4.8. The disclosure content of said document is incorporated by reference.

Figure 5A:
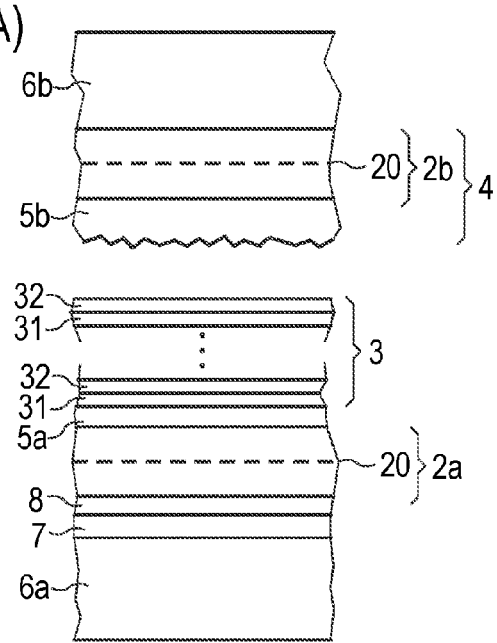
Figure 5B:
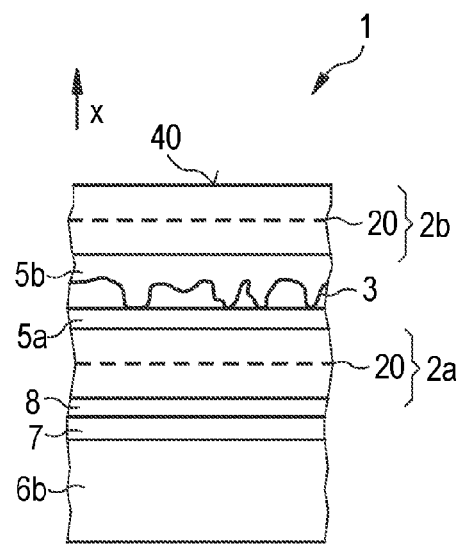

A further exemplary embodiment of the manufacturing method for the optoelectronic semiconductor component 1 is illustrated in FIGS. 5A and 5B, collectively referred to as FIG. 5. In accordance with FIG. 5A, a first semiconductor layer sequence 2a on a first carrier 6a is provided. 125 periods of a stoichiometrically correct 10 nm thick double layer comprising Zn and comprising S are applied on the first semiconductor layer sequence 2a. In other words, a total of 250 partial layers 31, 32 are present.

Furthermore, the radiation-transmissive element 4 is provided, which comprises the second semiconductor layer sequence 2b on the second carrier 6b. The second carrier 6b is preferably an epitaxial substrate for the second semiconductor layer sequence 2b.

An intermediate layer 5b is optionally situated at the second semiconductor layer sequence 2b at a side facing away from the second carrier 6b. The intermediate layer 5b is shaped from a transparent conductive oxide, for example. Such a further intermediate layer 5a can also be fitted between the first semiconductor layer sequence 2a and the connecting element 3. The intermediate layers 5a, 5b can be provided with a surface structuring.

FIG. 5B shows the finished manufactured semiconductor component 1. The connection between the two component parts of the semiconductor component 1 is effected, for example, at a temperature of approximately 400° C. and at a pressure of 10 MPa. The partial layers 31, 32 are briefly melted as a result. The reaction of Zn and S causes the connecting element to solidify to form transparent ZnS. In this case, roughness peaks of the intermediate layer 5b penetrate through the layer of the connecting element 3. As a result, the intermediate layers 5a, 5b are electrically connected to one another.

In a departure from the illustration in FIG. 5B, it is also possible for roughnesses of the semiconductor layer sequences 2a, 2b themselves to penetrate through the connecting element 3. In contrast to what is depicted, it is possible for a further connecting element 3 and a further semiconductor layer sequence to be applied at the side 40 of the second semiconductor layer sequence 2b which faces away from the carrier 6a. In addition, other radiation-transmissive elements 4, for example, as described in conjunction with FIG. 2 or FIG. 3, can likewise be fitted.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A method of manufacturing an optoelectronic semiconductor component, the method comprising:
    providing a semiconductor layer sequence comprising an active layer configured to generate an electromagnetic radiation;
    providing a radiation-transmissive element;
    applying a connecting element to at least one of the semiconductor layer sequence and the radiation-transmissive element; and
    connecting the semiconductor layer sequence to the radiation-transmissive element with a connecting element;
    wherein the connecting element comprises a plurality of main constituents that are solids at a temperature of 300 K, at least one of the main constituents having a melting point of at most 750 K;
    wherein at least two of the main constituents of the connecting elements are applied separately from one another in at least two partial layers alternately one above another;
    wherein during the connecting is performed at a connecting temperature that is greater than the melting point of at least one of the main constituents;
    wherein the main constituents mix together during the connecting so that the partial layers dissolve during the connecting and the connecting element is embodied as a homogeneous layer;
    wherein the connecting element is shaped in a layer-like fashion and the semiconductor layer sequence is mechanically connected to the radiation-transmissive element via the connecting element after the connecting;
    wherein after connection, the connecting element is radiation-transmissive and is designed such that at least part of the radiation generated in the active layer passes through the connecting element; and
    wherein after connection, a refractive index of the connecting element deviates from a refractive index of the semiconductor layer sequence by at most 25%.

2. The method according to claim 1, wherein after the connecting, the connecting element comprises a material selected from the group consisting of: ZnS, ZnSe, ZnTe, CdS, CdSe, CdTe, MgS, MgSe, and MgTe.

3. The method according to claim 1, wherein the connecting element is free of a layer provided for generating radiation and the material of the connecting element differs from a material of the semiconductor layer sequence and from a material of the radiation-transmissive element.

4. The method according to claim 1, wherein the refractive index of the connecting element deviates from a refractive index of the radiation-transmissive element by at most 10%, after connecting.

5. The method according to claim 1, wherein a coefficient of thermal expansion of the connecting element deviates from a coefficient of thermal expansion of the radiation-transmissive element and/or of the semiconductor layer sequence by at most a factor of 2, after connecting.

6. The method according to claim 1, wherein the radiation-transmissive element comprises an optical body having a radiation coupling-out structure.

7. The method according to claim 1, wherein the radiation-transmissive element comprises a conversion element for partial or complete wavelength conversion of the radiation generated by the semiconductor layer sequence.

8. The method according to claim 1, wherein the radiation-transmissive element comprises a further semiconductor layer sequence having an active layer configured to generate radiation.

9. The method according to claim 1, wherein the connecting element is penetrated by roughness peaks of the semiconductor layer sequence, after connecting.

10. The method according to claim 1, wherein the connecting element has a thickness that is at least a factor of 1.5 above the sum of mean roughnesses of sides of the semiconductor layer sequence and of the radiation-transmissive element that face the connecting element layer, after connecting.

11. The method according to claim 1, wherein the connecting temperature is between the melting points of the main constituents.

12. The method according to claim 1, wherein the connecting temperature is above the melting points of the main constituents.

13. The method according to claim 1, wherein between 20 and 300 of the partial layers inclusive are applied.

14. The method according to claim 1, wherein the partial layers are applied with thicknesses such that the main constituents are present in a stoichiometrically correct quantitative ratio with respect to one another for the material of the connecting element.

15. The method according to claim 1, wherein the connecting element comprises exactly two main constituents.

16. A method of manufacturing an optoelectronic semiconductor component
wherein the component comprises a semiconductor layer sequence having an active layer configured to generate an electromagnetic radiation, a radiation-transmissive element; and a connecting element;
wherein the connecting element is shaped in a layer-like fashion and the semiconductor layer sequence is mechanically connected to the radiation-transmissive element via the connecting element;
wherein the connecting element is radiation-transmissive and is designed such that at least part of the radiation generated in the active layer passes through the connecting element;
wherein a refractive index of the connecting element deviates from a refractive index of the semiconductor layer sequence by at most 25%;
wherein the connecting element comprises a plurality of main constituents that are solids at a temperature of 300 K;
wherein at least one of the main constituents has a melting point of at most 750 K;
wherein the method comprises providing the semiconductor layer sequence and the radiation-transmissive element, applying the connecting element to the semiconductor layer sequence and/or to the radiation-transmissive element, and connecting the semiconductor layer sequence to the radiation-transmissive element;
wherein at least two of the main constituents of the connecting element are applied separately from one another in at least two partial layers alternately one above another;
wherein during connecting a connecting temperature is greater than the melting point of at least one of the main constituents; and
wherein the main constituents mix together during connecting.

17. The method according to claim 16, wherein the partial layers dissolve during connecting and the connecting element is embodied as a homogeneous layer.

* * * * *